US011264710B2

(12) United States Patent
Rodriguez, Jr. et al.

(10) Patent No.: US 11,264,710 B2
(45) Date of Patent: Mar. 1, 2022

(54) MOUNTING STRUCTURE FOR DATA COMMUNICATION APPARATUS AND SYSTEM

(71) Applicant: 3M INNOVATIVE PROPERTIES COMPANY, St. Paul, MN (US)

(72) Inventors: Ernesto M. Rodriguez, Jr., Austin, TX (US); Steven E. Turch, Blaine, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 709 days.

(21) Appl. No.: 16/074,169

(22) PCT Filed: Jan. 19, 2017

(86) PCT No.: PCT/US2017/014118
§ 371 (c)(1),
(2) Date: Jul. 31, 2018

(87) PCT Pub. No.: WO2017/136149
PCT Pub. Date: Aug. 10, 2017

(65) Prior Publication Data
US 2021/0135349 A1 May 6, 2021

Related U.S. Application Data

(60) Provisional application No. 62/291,245, filed on Feb. 4, 2016.

(51) Int. Cl.
*H01Q 1/42* (2006.01)
*E02D 29/14* (2006.01)
(Continued)

(52) U.S. Cl.
CPC .............. *H01Q 1/42* (2013.01); *E02D 29/14* (2013.01); *G08C 17/02* (2013.01); *H01Q 1/002* (2013.01); *H01Q 1/04* (2013.01); *H01Q 1/241* (2013.01)

(58) Field of Classification Search
CPC ............ H01Q 1/42; H01Q 1/002; H01Q 1/04; H01Q 1/241; G08C 17/02; E02D 29/14
See application file for complete search history.

(56) References Cited

U.S. PATENT DOCUMENTS 6,218,995 B1 * 4/2001 Higgins .................. H01Q 1/42
343/719
8,135,352 B2 3/2012 Langsweirdt et al.
(Continued)

FOREIGN PATENT DOCUMENTS

CN 204288395 U 4/2015
JP 2015-010403 1/2015
(Continued)

OTHER PUBLICATIONS

Supplementary European Search Report for EP Appl. No. 17747912.8, dated Aug. 22, 2019, 2 pp.
(Continued)

*Primary Examiner* — Seokjin Kim
(74) *Attorney, Agent, or Firm* — Gregg H. Rosenblatt

(57) ABSTRACT

A mounting structure for protecting a transceiver located on an underside of a manhole cover is formed from a metal or rugged plastic in the shape of a truncated dome or cone with a sloping sidewall and a cavity configured to receive a transceiver, wherein the mounting structure is mountable to an underside of the manhole cover. A data communication system for an enclosure comprises a transceiver configured to communicate with a network outside of the enclosure and a mounting structure to mount the transceiver to an underside of the manhole cover. The mounting structure is con-
(Continued)

figured to protect the transceiver from damage during removal of the manhole cover from the entrance port of the enclosure.

12 Claims, 6 Drawing Sheets

(51) Int. Cl.
*G08C 17/02* (2006.01)
*H01Q 1/00* (2006.01)
*H01Q 1/04* (2006.01)
*H01Q 1/24* (2006.01)

(56) References Cited

U.S. PATENT DOCUMENTS

| | | | |
|---|---|---|---|
| 8,258,977 B1* | 9/2012 | Montestruque | G01F 15/063 340/870.02 |
| 2004/0037084 A1* | 2/2004 | Ginsburg | F21S 8/086 362/431 |
| 2007/0159326 A1* | 7/2007 | Quist | G01F 23/0076 340/539.26 |
| 2007/0296607 A1* | 12/2007 | Salser | G01D 4/002 340/870.02 |
| 2008/0074283 A1 | 3/2008 | Vekleeren | |
| 2012/0191380 A1* | 7/2012 | Winter | G01D 4/006 702/45 |
| 2015/0041598 A1 | 2/2015 | Nugent | |
| 2017/0127156 A1 | 5/2017 | Rodriguez, Jr. et al. | |

FOREIGN PATENT DOCUMENTS

| | | |
|---|---|---|
| WO | WO 2014-209739 | 12/2014 |
| WO | WO 2015-041906 | 3/2015 |
| WO | WO 2015-195861 | 12/2015 |
| WO | WO 2016-205295 | 12/2016 |

OTHER PUBLICATIONS

"Preventing and Mitigating Manhole Events", IEEE Insulated Conductors Committee—C34D, Jul. 7, 2015, 34 pages.

International Search Report for PCT International Application No. PCT/US2017/014118, dated Apr. 25, 2017, 3 pages.

Search Report for CN Appl. No. 201780009383.0, dated May 27, 2020, 2 pp.

* cited by examiner

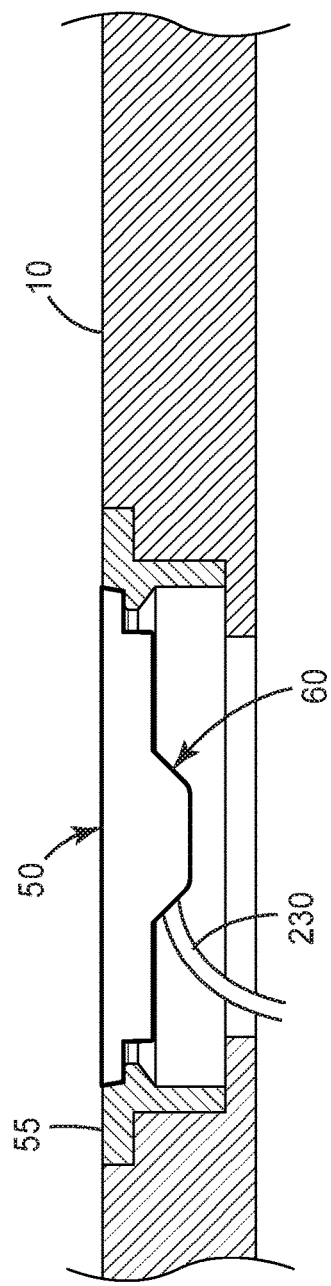
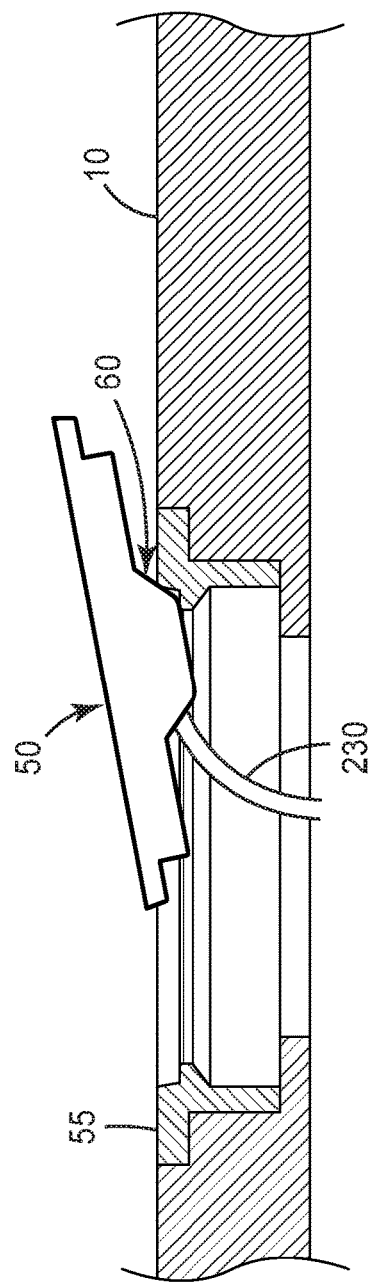
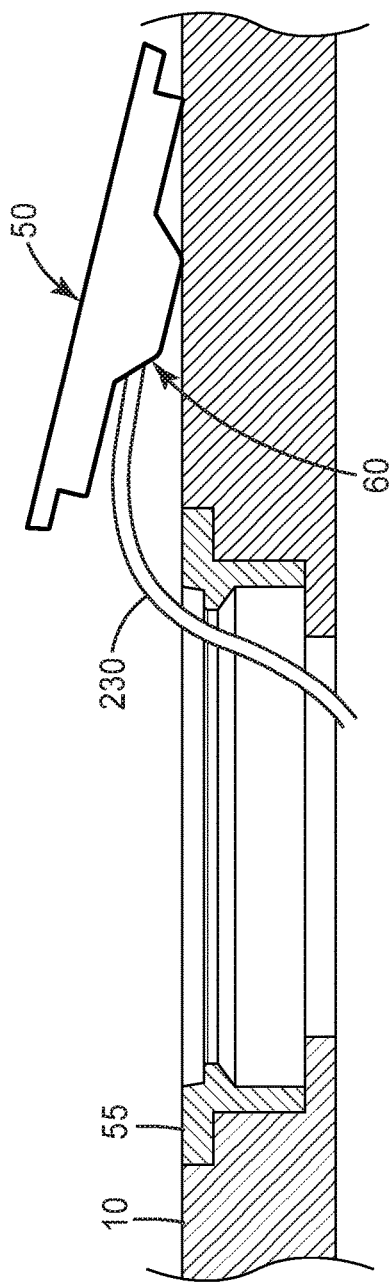
FIG. 4A
FIG. 4B
FIG. 4C

MOUNTING STRUCTURE FOR DATA COMMUNICATION APPARATUS AND SYSTEM

BACKGROUND

Machine to machine communication is becoming increasingly important to the energy, communications, and security markets, among others. Supervisory Control and Data Acquisition (SCADA) systems used in those industries rely on inputs from remotely located sensors to function properly. SCADA systems can also output signals to actuate remote equipment in the field. A sizeable portion of that equipment (~18% for U.S. electric utilities) is located underground, and providing wireless communications between above ground and underground equipment is a serious challenge.

Current methods used to locate underground cable faults are still slow and labor intensive. Even relatively short outages can be used against utilities and lead to rate adjustments for customers, so a faster means of locating and fixing underground faults is needed.

Thus, there is a need for accessing and communicating wireless signals into and out of underground equipment vaults and other structures where the underground equipment is located.

SUMMARY OF THE INVENTION

In one aspect of the invention, a data communication system for an enclosure comprises a transceiver located on an underside of a manhole cover located at an entrance port to the enclosure, wherein the transceiver is configured to communicate with a network outside of the enclosure, and a mounting structure to mount the transceiver to an underside of the manhole cover, the mounting structure configured to protect the transceiver from damage during removal of the manhole cover from the entrance port of the enclosure.

In another aspect, a mounting structure for protecting a transceiver located on an underside of a manhole cover is formed from a metal or rugged plastic in the shape of a truncated dome or cone with a sloping sidewall and a cavity configured to receive a transceiver, wherein the mounting structure is mountable to an underside of the manhole cover.

The above summary of the present invention is not intended to describe each illustrated embodiment or every implementation of the present invention. The figures and the detailed description that follows more particularly exemplify these embodiments.

BRIEF DESCRIPTION OF THE DRAWINGS

The invention will be described hereinafter in part by reference to non-limiting examples thereof and with reference to the drawings, in which:

FIGS. 4A-4C illustrate a manhole cover removal process.

Figure 1:
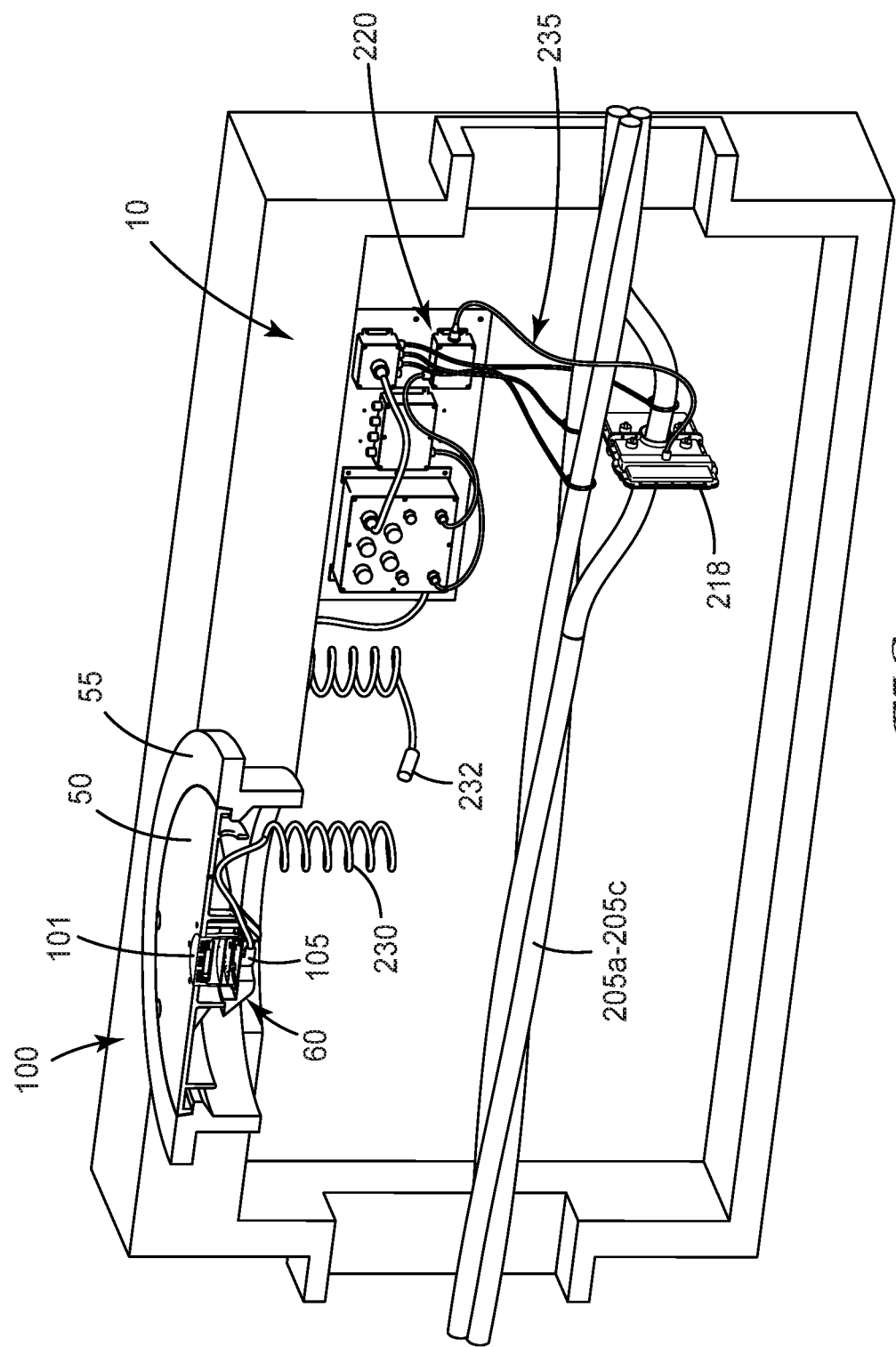
FIG. 1 is a partial isometric view of a data communication system disposed in an enclosure according to an aspect of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A mounting structure for a data communication apparatus or system is described herein that can be utilized in an enclosure, such as an underground enclosure. The mounting structure can protect the integrated electronics, such as a transceiver and connector, that are mounted on, e.g., the underside of a manhole cover, and/or tethered cabling that connects the integrated electronics with equipment within the enclosure from damage that can be incurred in the process of removing the manhole cover from the enclosure. The mounting structure can be configured as a truncated dome or cone, with a sloping sidewall and an opening to allow access to a connector location on the integrated electronics. This design is orientation independent and allows the manhole cover to be rotated to any position on the entrance port to the enclosure.

FIG. 1 shows one aspect of the present invention, a data communication system 100. In this aspect, the data communication system 100 is an underground data communication system. FIGS. 2A-2C and FIG. 3 show different views of certain components of the data communication system.

Figure 2A:
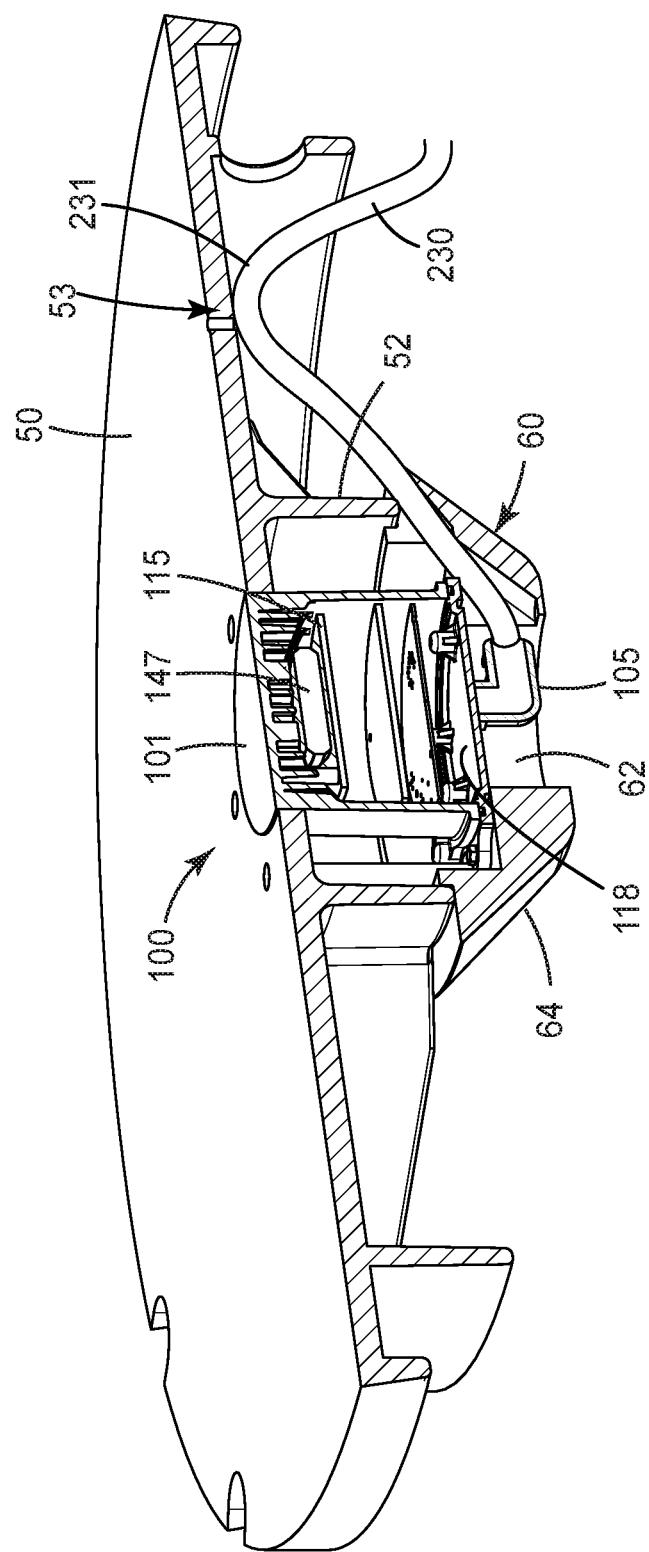
FIG. 2A is an isometric cross section view of a data communication system according to another aspect of the invention.
Figure 2B:
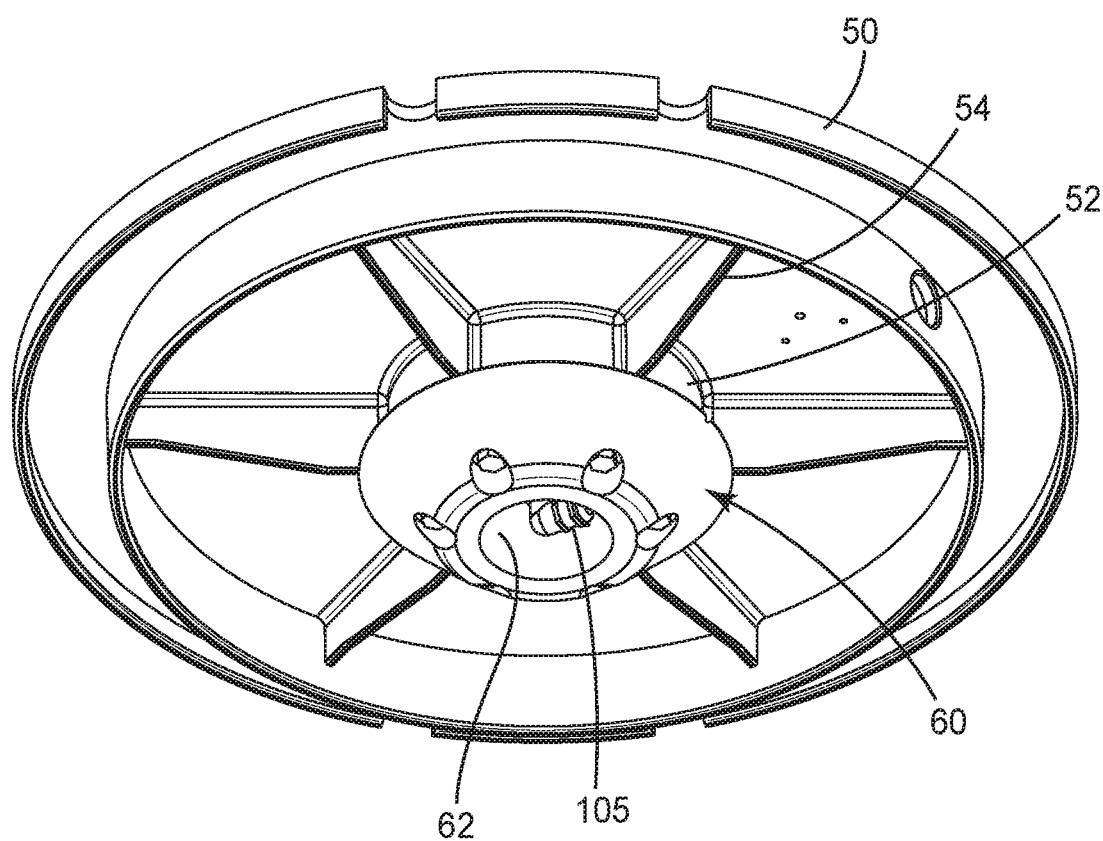
FIG. 2B is an isometric bottom view of a mounting structure secured to the bottom side of a manhole cover according to another aspect of the invention.
Figure 2C:
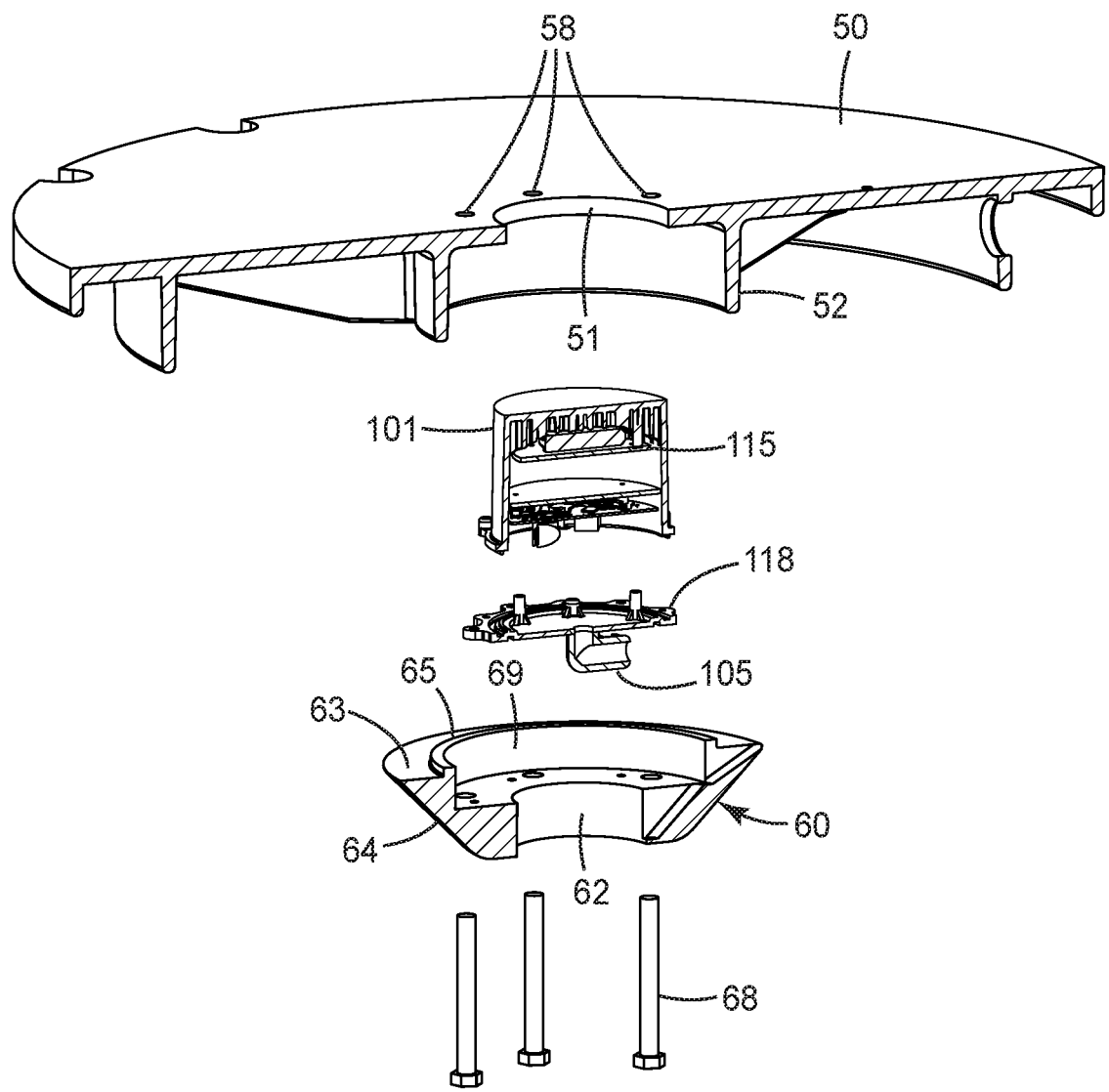
FIG. 2C is a cross section exploded view of a transceiver and mounting structure according to another aspect of the invention.

In one aspect, the data communication system 100 can provide a communication infrastructure to relay vault condition information to an above ground network or SCADA, and protect that communication equipment from damage when a service technician needs to remove the manhole cover to physically enter or access vault or enclosure 10. As shown in FIG. 1, the data communication system 100 comprises a transceiver 101 configured to communicate with a network outside of the enclosure. In one aspect, the transceiver 101 is mounted within a housing that is mountable via a mounting structure 60 to a manhole cover 50. As shown in the exploded view of FIG. 2C, the transceiver housing can include a cover or top portion 115 and a bottom portion 118. As shown in FIG. 2A, the transceiver 101 can also include an antenna and radio 147 which communicates with widely available above-ground wireless communications networks such as WiFi, WiMax, mobile telephone (3G, 4G, LTE, GSM), private licensed bands, non-licensed bands, etc. In another aspect, the transceiver can comprise a passive antenna without the corresponding radio, which can be housed in another portion of the vault. The transceiver can have a size configured to closely pass through opening 51 formed in the manhole cover. In one aspect, the top surface of the transceiver may be substantially flush with the top surface of the manhole cover 50, such as is illustrated in FIG. 2A. Optionally, the transceiver 101 can also include a micro controller or microprocessor (not shown) to control transceiver communication operations, content and timing.

The transceiver housing can be a sealed structure and may include one or more housing parts such as a cover and base portion. At least some of the housing parts may be made of a moldable plastic material. The material of the housing parts may be resistant against aggressive substances. The housing can be sealed to protect the radio, antenna, and other components contained within it. By using a seal of appropriate material, such as a graphite-containing material, a seal may additionally be provided against aggressive substances like gasoline or oil which may be present in an outside environment. In another aspect, for example, the housing can comprise a polycarbonate material with a polyurethane core, with a ribbed area that provides flexibility to keep the polycarbonate material from cracking. Alternative transceiver configurations are described in U.S. Provisional Application No. 62/180,417 incorporated by reference herein in its entirety.

In addition, as shown in FIG. 1, the data communication system 100 can also include a sensor analytics unit (SAU) 220, which is mounted in the enclosure 10. In this aspect, a tethered cable 230 can connect the transceiver 101 with the sensor analytics unit 220 via copper and/or fiber cabling. As described further below, the mounting structure 60 can protect both the transceiver 101 and tethered cable 230 from damage during removal of the manhole cover 50 from the entrance port 55. The SAU 220 can be connected to one or more sensors or other equipment located in vault 10.

In an alternative aspect of the invention, the transceiver 101 can be a fully integrated transceiver that can also include a power source (such as a battery or supercapacitors) to power the transceiver 101 on an at least intermittent basis.

As shown in FIG. 1, data communication system 100 is disposed in an exemplary underground enclosure, here underground vault 10. In this example implementation, vault 10 includes a variety of equipment, such as one or more high voltage electrical lines, such as electrical lines 205a-205c (carrying e.g., low, medium or high voltage power), and associated components and/or accessories, such as a power harvester 208, and associated cables 235. The vault can contain additional equipment, such as is described in PCT Patent Appl. No. PCT/US2015/036345, incorporated by reference herein in its entirety.

As shown in FIG. 1, in this example, a power cable, such as a low, medium or high voltage power cable 205a-205c is located in vault 10. A monitoring device can be configured as a sensor disposed on a cable accessory, such as a termination. Such a sensor can provide sensing capabilities that measure a cable condition, such as voltage, current, and/or temperature. An exemplary sensored termination is described in U.S. Provisional Application No. 61/839,543, incorporated by reference herein in its entirety.

The enclosure or vault 10 can be accessed from above ground via a portal or entrance port 55 that includes a manhole cover 50, which can be formed from a metal or non-metal, and can have a conventional circular shape. In one aspect, the manhole cover 50 can be mounted on a ring, frame or flange structure of the entrance port 55. In this aspect, vault 10 is can be constructed as a conventional underground vault, commonly used by electric, gas, water, and/or other utilities. However, in alternative aspects, the underground data communication system 100 can be utilized in another type of underground enclosure or similar structure, such as a manhole, basement, cellar, pit, shelter, pipe, or other underground enclosure.

The SAU 220 can be mounted at a central location within the vault 10, or along a wall or other internal vault structure. The SAU 220 can include a digital signal processor (DSP) or system on a chip (SOC) to receive, manipulate, analyze, process, or otherwise transform such data signals into signals useable in a supervisory control and data acquisition (SCADA) system. In addition, the DSP can perform some operations independently of the SCADA. For example, the DSP can perform fault detection, isolation, location and condition monitoring and reporting. Moreover, the DSP/SAU can be programmed to provide additional features, such as Volt, VAR optimization, phasor measurement (synchnophaser), incipient fault detection, load characterization, post mortem event analysis, signature waveform identification and event capture, self-healing and optimization, energy auditing, partial discharge, harmonics/sub-harmonics analysis, flicker analysis and leakage current analysis. In another aspect, the SAU 220 can further include a radio, such as radio 147, such as when transceiver 101 comprises a passive antenna only.

In addition, the DSP and other chips utilized in the SAU 220 can be configured to require only low power levels, on the order of less than 10 W. In this aspect, SAU 220 can be provided power via a power harvesting coil 218 that can be coupled to one of the electrical lines to provide sufficient power to the SAU 220.

In addition, the SAU 220 can be implemented with a backup battery (not shown). Further, the SAU 220 can include additional sensors to monitor, e.g., environmental conditions within the enclosure.

The processed data from the SAU 220 can be communicated to a network or SCADA via a transceiver 101.

In one aspect of the invention, the vault 10 also includes at least one monitoring device disposed therein which can monitor a physical condition of the vault or of the components or equipment located in the vault. Such conditions would normally be difficult to gather or assess from aboveground. The monitoring device can comprise one or more of the following sensors: power, voltage, current, temperature, combustible materials or byproducts of combustion, mechanical strain, mechanical movement (e.g. revolutions per minute), humidity, soil condition (acidity, moisture content, mineral content), pressure, hazardous atmosphere, liquid flow, leakage, component end-of-life or lifetime (e.g., a cathodic protection sensor), personnel presence (e.g., has someone entered the enclosure), physical state (e.g., is the enclosure open or closed, is a switch or valve open or closed, has an item been tampered with), light sensor, vibration (seismic, tampering).

As shown in more detail in FIGS. 2A-2C and FIG. 3, the mounting structure 60 provides a support for mounting the transceiver 101 to the underside of the manhole cover 50. As shown in FIG. 2A, a typical manhole cover 50 includes a central support ring 52 from which ribs 54 radially extend towards the outer edges of the manhole cover 50. Such a typical manhole cover is very heavy (e.g., about 150 lbs.) and must be removed through the use of a tool, such as a manhole cover lifting tool.

While mounting structure 60 is shown in the figures as having a truncated dome or cone shape, with sloping sidewall 64, the overall shape of the mounting structure may take a different form, as would be apparent to one of ordinary skill in the art given the present description.

In one aspect, the mounting structure 60 can include a circular rib 65 (see e.g., FIG. 2C) that has an outer diameter suitable for mating with the inner surface of central support ring 52. The mounting structure can also include a ledge surface 63 the rests against the bottom surface of the central support ring 52. In addition, mounting structure 60 can further include a depression region 69, the depth of which can depend on the size of the transceiver 101. This configuration creates a cavity or pocket formed between the interior region of the central ring portion of manhole cover and the depression region 69 of the mounting structure in which the transceiver 101 can be housed when in use. Bolts 68 (e.g., threaded bolts), configured to mate with tapped or through screw holes 58 formed in the manhole cover, or other robust securing devices, can be used to secure the mounting structure 60 to the underside of the manhole cover 50.

Figure 3:
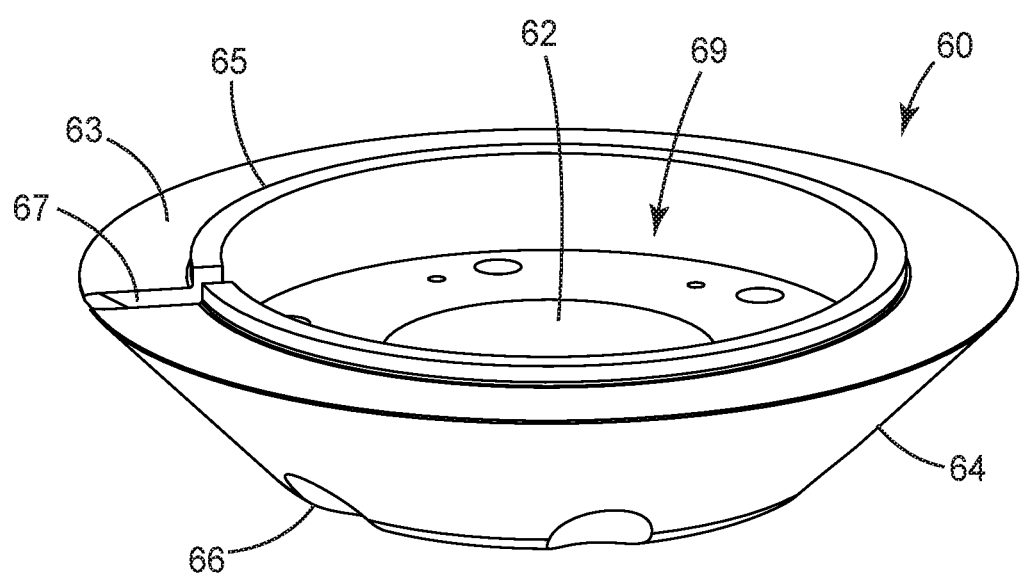
FIG. 3 is an isometric view of a mounting structure according to another aspect of the invention.

In addition, the mounting structure 60 can further include a lower opening 62 that has sufficient depth and diameter to surround a connector 105 that is mounted on the bottom portion 118 of the transceiver 101. The connector 105 can be used to couple the transceiver 101 to the tethered cable 230, which in turn can be coupled to the SAU 220, or other equipment located in vault 10. Further, as shown in FIG. 3, mounting structure 60 can include a slot 67 having a sufficient width to permit passage of the tethered cable 230 from the connector 105 through the side wall 64 of mounting structure 60. The tethered cable can include a tether string or filament 231 that is secured to a portion 53 of the manhole cover 50. This tethering can help further protect the cable 230 from damage during the manhole cover removal process. Optionally, tethered cable 230 can include a breakaway connector 232 (see e.g., FIG. 1), such as a conventional mechanical (e.g., snap fit) or magnetic connector or coupling, which is configured to break a connection when the pulling force reaches a modest level, thus protecting the connector 105 and/or SAU 220 from damage if the manhole cover is displaced a great distance from the entrance port 55.

In one aspect, mounting structure 60 is formed from a metal or rugged plastic material. The structural integrity of the mounting structure 60 is important for protecting the transceiver 101, connector 105, and tethered cable 230 of the data communication system during normal operation and during removal of the manhole cover 50 from vault 10.

During this removal process, oftentimes the manhole cover is open from any side or angle and/or dragged away from the entrance port. This removal process is illustrated in FIGS. 4A-4C. FIG. 4A shows the manhole cover in its normal assembled position. The mounting structure 60 protects the transceiver 101/connector 105/cable 230 by having a sloping sidewall 64 that extends beyond the depth of the transceiver 101/connector 105. In FIG. 4B, the manhole cover is being removed from the entrance port. Because of its weight, the bottom side of the manhole cover 50 is usually dragged against the side of the entrance port 55. In this manner, mounting structure 60 protects the transceiver and the connector 105/tethered cable 230 from directly contacting the side of entrance port 55. Moreover, without the mounting structure, such contact could substantially damage the data communication system. In addition, the sloping side wall 64 of the mounting structure allows the manhole cover to be removed in a continuous manner, without having the mounting structure/transceiver stop or snag against the side of the entrance port, which could further make the removal process more difficult. In this regard, the sloping sidewall can have an angle of about 20 degrees to about 70 degrees, with respect to the central axis of the mounting structure. When the manhole cover is fully removed from the entrance port 55, such as is shown in FIG. 4C, the robust construction of the mounting structure 60 can support the weight of the manhole cover 50, allow passage of the cable 230, and protect the transceiver 101 and connector 105 from damage due to any rough or smooth surface type (e.g., concrete, asphalt, gravel, etc.).

The present invention has now been described with reference to several individual embodiments. The foregoing detailed description has been given for clarity of understanding only. No unnecessary limitations are to be understood or taken from it. All references to right, left, front, rear, up and down as well as references to directions are exemplary only and do not limit the claimed invention. It will be apparent to those persons skilled in the art that many changes can be made in the embodiments described without departing from the scope of the invention. Thus, the scope of the present invention should not be limited to the details and structures described herein, but rather by the structures described by the language of the claims, and the equivalents of those structures.

The invention claimed is:

1. A data communication system for an enclosure, comprising:
   a transceiver located on an underside of a manhole cover located at an entrance port to the enclosure, wherein the transceiver is configured to communicate with a network outside of the enclosure;
   a mounting structure to mount the transceiver to an underside of the manhole cover, the mounting structure configured to protect the transceiver from damage during removal of the manhole cover from the entrance port of the enclosure, wherein the mounting structure is formed from a metal or rugged plastic in the shape of a truncated dome or cone with a sloping sidewall and a cavity configured to receive a transceiver, wherein the mounting structure is mountable to the underside of the manhole cover.

2. The data communication system of claim 1, further comprising:
   a sensor analytics unit to process data from a monitoring device or sensor disposed in the enclosure and to generate a processed data signal and to communicate the processed data signal to the transceiver.

3. The data communication system of claim 2, further comprising:
   a connector located on a bottom portion of the transceiver, wherein the mounting structure includes a lower opening having sufficient depth and diameter to surround the connector.

4. The data communication system of claim 3, further comprising:
   a cable connecting the sensor analytics unit to the transceiver via the connector.

5. The data communication system of claim 4, wherein the cable comprises a tethered cable having a tether string or filament coupled to the cable and that is attached to the underside of the manhole cover.

6. The data communication system of claim 1, wherein the sloping sidewall has an angle of about 20 degrees to about 70 degrees, with respect to a central axis of the mounting structure.

7. The data communication system of claim 1, wherein the mounting structure further comprises a slot having a sufficient width to permit passage of the cable extending from the transceiver through a side wall of the mounting structure.

8. The data communication system of claim 1, wherein a portion of the mounting structure mates with an inner surface of a central support ring of the manhole cover, wherein the mounting structure further includes a depression region, wherein a cavity is formed between the manhole cover and the depression region, the cavity sufficient to receive the transceiver.

9. The data communication system of claim 5, where the tethered cable includes a breakaway connector configured to detach under a pulling force.

10. The data communication system of claim 1, wherein the enclosure comprises an underground vault.

11. The data communication system of claim 1, wherein the transceiver is directly mounted to the mounting structure.

12. The data communication system of claim 1, wherein the mounting structure is directly mounted to the manhole cover.

\* \* \* \* \*